(12) United States Patent
Silverstein

(10) Patent No.: US 9,548,474 B2
(45) Date of Patent: Jan. 17, 2017

(54) METHODS FOR CUSTOM-FITTING A RADIANT ENERGY TRANSFER PANEL

(71) Applicant: Global OLED Technology LLC, Herndon, VA (US)

(72) Inventor: Barry D Silverstein, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 0 days.

(21) Appl. No.: 15/149,716

(22) Filed: May 9, 2016

(65) Prior Publication Data

US 2016/0254499 A1    Sep. 1, 2016

Related U.S. Application Data

(63) Continuation of application No. 14/156,072, filed on Jan. 15, 2014, now Pat. No. 9,362,432, which is a
(Continued)

(51) Int. Cl.
| | |
|---|---|
| *H01L 31/042* | (2014.01) |
| *H01L 51/56* | (2006.01) |
| *H01L 51/50* | (2006.01) |
| *H01L 31/02* | (2006.01) |
| *H01L 31/0392* | (2006.01) |
| *H01L 31/054* | (2014.01) |
| *H01L 31/0224* | (2006.01) |

(Continued)

(52) U.S. Cl.
CPC ......... *H01L 51/56* (2013.01); *H01L 31/02008* (2013.01); *H01L 31/022433* (2013.01); *H01L 31/03926* (2013.01); *H01L 31/042* (2013.01); *H01L 31/054* (2014.12); *H01L 31/0543* (2014.12); *H01L 31/18* (2013.01); *H01L 51/5012* (2013.01); *H01L 51/5221* (2013.01); *H01L 51/5268* (2013.01); *H01L 51/5275* (2013.01); *H01L 51/5203* (2013.01); *H01L 2251/566* (2013.01); *Y02E 10/50* (2013.01)

(58) Field of Classification Search
CPC .................................. H01L 31/042; F24J 2/46
See application file for complete search history.

(56) References Cited

U.S. PATENT DOCUMENTS

| | | | | |
|---|---|---|---|---|
| 4,356,429 A | * | 10/1982 | Tang ...................... | H05B 33/20 313/503 |
| 4,574,160 A | * | 3/1986 | Cull .................. | H01L 31/02008 136/244 |

(Continued)

*Primary Examiner* — Golam Mowla
(74) *Attorney, Agent, or Firm* — Global OLED Technology LLC

(57) ABSTRACT

A radiant energy transfer panel is resized from an array of individually sealed segments by cutting the array along a cut line, thereby damaging some segments by breaking their seals. Other segments adjacent to the damaged segments are left intact. Each segment has two electrodes for power connection. Electrodes of the damaged segments remain electrically connected to electrodes of undamaged segments after cutting. An edge member may be positioned to overlap damaged segments and redirect light from undamaged segments to compensate for the damaged segments. In alternative embodiments, the edge member may be light-blocking. The radiant energy transfer panel may be an electroluminescent panel or a photovoltaic panel.

9 Claims, 10 Drawing Sheets

Related U.S. Application Data continuation of application No. 11/294,232, filed on Dec. 5, 2005, now Pat. No. 8,829,328.

(51) Int. Cl.
  *H01L 31/18* (2006.01)
  *H01L 51/52* (2006.01)

(56) References Cited

U.S. PATENT DOCUMENTS

| | | | | |
|---|---|---|---|---|
| 4,652,693 | A * | 3/1987 | Bar-On | H01L 31/0201 136/244 |
| 4,860,509 | A * | 8/1989 | Laaly | H01L 31/03926 136/245 |
| 5,528,476 | A * | 6/1996 | Fenton | A63H 27/08 244/155 R |
| 6,290,713 | B1 * | 9/2001 | Russell | A61N 5/0616 607/88 |
| 6,340,789 | B1 * | 1/2002 | Petritsch | H01L 51/0024 136/255 |
| 6,819,036 | B2 * | 11/2004 | Cok | H01R 12/7076 313/318.01 |
| 2002/0038663 | A1 * | 4/2002 | Zenko | H01L 31/02 136/244 |
| 2004/0144043 | A1 * | 7/2004 | Stevenson | E04D 5/00 52/173.3 |
| 2004/0252488 | A1 * | 12/2004 | Thurk | E04B 9/045 362/147 |
| 2005/0094394 | A1 * | 5/2005 | Padiyath | H01L 51/5203 362/249.01 |
| 2007/0079869 | A1 * | 4/2007 | Yukinobu | H01G 9/2022 136/263 |
| 2007/0125368 | A1 * | 6/2007 | Silverstein | H01L 31/042 126/627 |

* cited by examiner

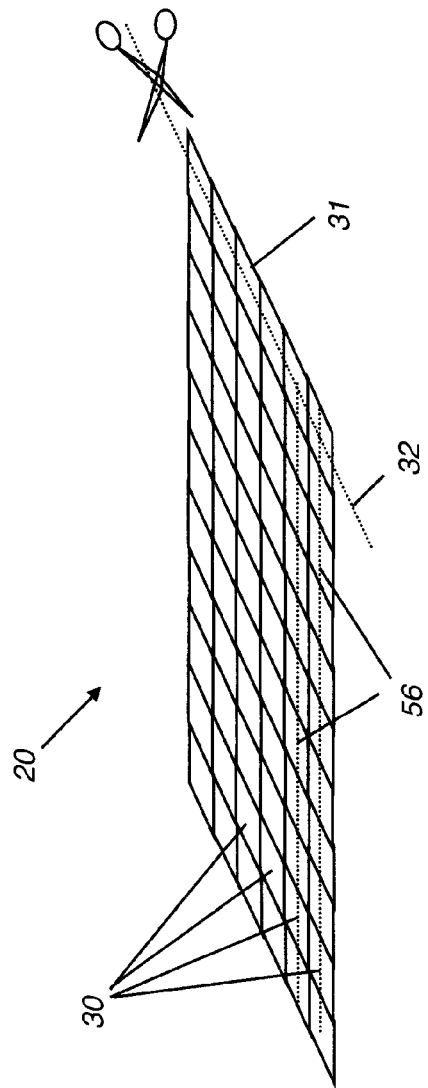

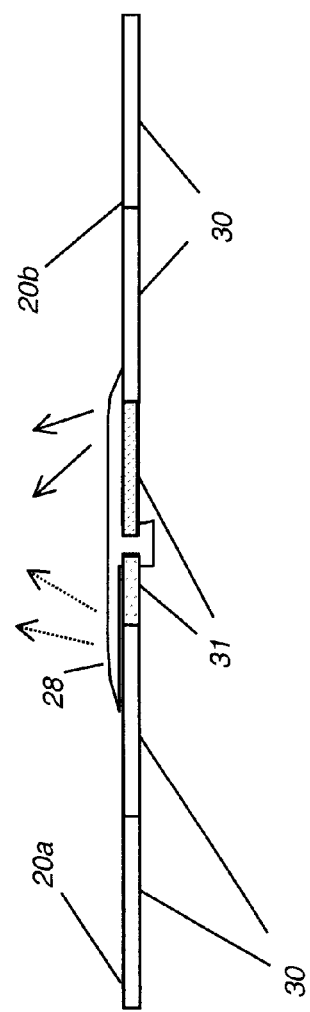
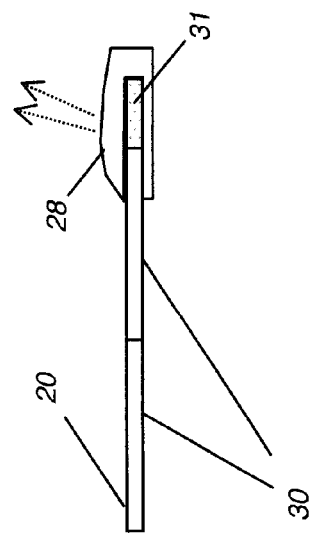

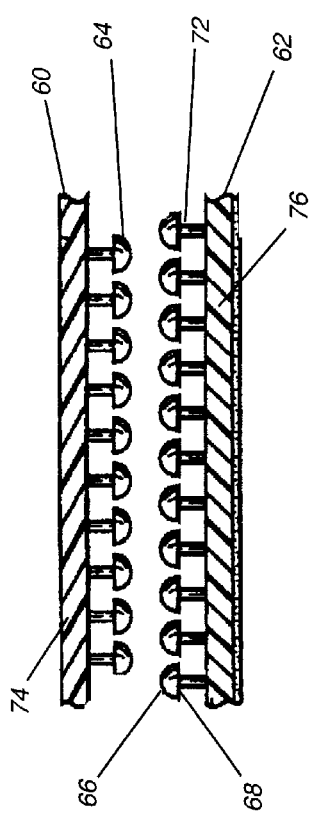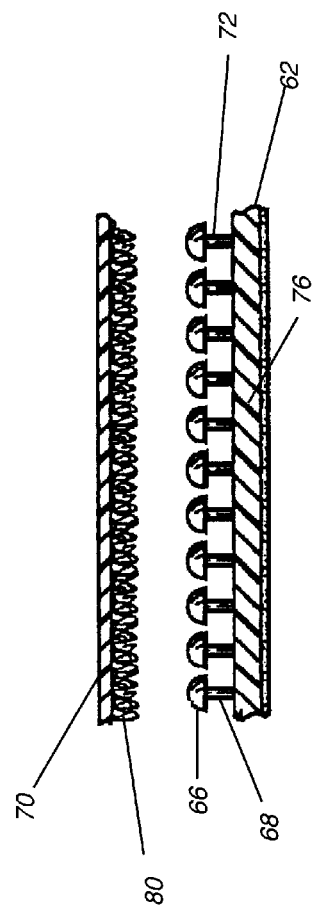
FIG. 7A
FIG. 7B

METHODS FOR CUSTOM-FITTING A RADIANT ENERGY TRANSFER PANEL

CROSS-REFERENCE TO RELATED APPLICATION

This application is a continuation of U.S. Ser. No. 14/156,072, filed Jan. 15, 2014 entitled "RADIANT ENERGY TRANSFER PANEL MOUNTINGS" by Barry D. Silverstein, since published as U.S. 2014-0124012 A1, which is a continuation of U.S. Ser. No. 11/294,232, filed Dec. 5, 2005 entitled "RADIANT ENERGY TRANSFER PANEL MOUNTINGS" by Barry D. Silverstein, since issued as U.S. Pat. No. 8,829,328, both of which are incorporated by reference for all purposes as if fully set forth herein.

FIELD OF THE INVENTION

This invention generally relates to a radiant energy transfer panel and more particularly relates to methods for forming a custom-fitted radiant energy transfer panel by cutting an array of individually sealed segments.

BACKGROUND OF THE INVENTION

Energy transfer between radiant energy and electrical energy can be performed in either of two directions. In one direction, such as when using a solar photovoltaic cell, absorbed radiant energy is converted to an electrical charge that can be directly used or stored. In the other direction, such as when using a lamp, lighting element, or self luminescent display, electrical current is used to provide radiant energy.

In conventional practice, standard point-to-point wiring connections have been used in order to provide the electrical connection to an energy-producing or light-producing element. With the recent maturing of a number of radiant energy transfer technologies, however, there may be opportunities for improving upon conventional techniques. Of particular interest are methods for electrical interconnection with a new generation of thin, large-area panels that are well suited to either absorb light or to provide light.

In the energy generation arena, numerous companies are developing inexpensive roll coated substrates with materials that generate electricity from sunlight. For example Nanosolar Inc., Palo Alto, Calif. has developed a technology for providing flexible solar panels that are lightweight and robust. Thin photovoltaic panels of this type maximize the area for light absorption and may promise a good degree of conformance to surfaces that are non-planar. Due to their lightweight construction and low profile, flexible photovoltaic panels such as those proposed by Nanosolar Inc. are easier to mount in place, not requiring supporting structural enhancements to buildings, such as those often needed with earlier solar power technologies.

For radiant energy transfer in the opposite direction, thin-panel electroluminescent solid state lighting offers the promise of reduced energy consumption and increased efficiency for a range of lighting and display applications. One of the key contending technologies for the solid-state lighting market is the organic light emitting device (OLED). Originally developed for small-scale display applications, OLEDs have also been proposed as replacements for conventional light sources. As just one example of OLED use for illumination, commonly-assigned U.S. Pat. No. 6,819,036 (Cok) discloses a solid state lighting device with a removable OLED that is outfitted for an electrical socket.

As they increase in size and light output efficiency, OLEDs have attracted considerable attention for larger scale illumination uses. A report entitled "Organic Light Emitting Diodes (OLEDs) for General Illumination Update 2002" from the Optoelectronics Industry Development Association, Washington, D.C. suggests strongly that OLED panels and related devices will be formidable contenders for the lighting market. In comparison with existing lighting technologies, it is anticipated that OLED illumination panels would provide high levels of energy efficiency and pleasing white light with high CRI (color rendition index).

Large-scale OLED panels could provide a viable alternative to fluorescent and incandescent lighting. In addition, OLED illumination panels offer new capabilities for illumination applications. Because the OLED device itself is made up of extremely thin layers of material, an OLED illumination panel can be made to be comparatively lightweight and would be well suited for use where a compact light source is desirable. U.S. 2004/0252488 (Thurk) gives examples of one type of embodiment, using a large-scale OLED assembly for room illumination.

Another attractive aspect of the OLED device relates to flexible substrates. Because the OLED device can be formed on any number of different substrates, including a fabric or plastic backing material, an OLED illumination panel could be made to adapt to a surface shape, bending around corners or conformal to curved surfaces, for example.

Significant research and development have been directed to improving the energy efficiency, manufacturability, and cost of OLED technology, needed in order to make larger scale OLED illumination panels a reality. For example, U.S. 2005/0094394 (Padiyath et al.) describes a method of web fabrication for thin OLED segments that allows connection of an array of larger scale OLED components in series or in parallel.

In addition to OLED electroluminescent technology, other thin-panel technologies that offer the promise of high efficiency illumination are being developed. One proposed alternate approach is to use quantum dots in combination with either an electric field or another illumination source to provide white light. Quantum dots are made up of groupings of a very small number of atoms of material with typically less than 100 available free electrons. Upon driving this material electrically or photonically, quantum dots can emit efficient white light. When combined in a polymer, quantum dots can be coated onto a flexible substrate to provide a wide area illuminator. Other methods for providing electroluminescence include using nanoparticles.

While attention has been focused on thin-panel radiant energy transfer device development and fabrication, however, making such devices practical and benefiting from their inherent advantages will also require appropriate techniques for panel mounting and connection. While conventional wiring and mounting techniques could be employed, these methods may constrain the usability of OLED and other radiant energy transfer panels and could fail to take advantage of features such as light weight, surface conformability, and ease of handling for reconfiguration. In addition, other anticipated features of large-scale radiant energy transfer panels, such as the likely capability to reduce panel size, at least with respect to one dimension, present new challenges for providing mounting and electrical connection to these devices.

Thus, there is a need for connection methods and apparatus that take advantage of radiant energy transfer panel characteristics such as conformability, variable dimensioning, and light weight, and that would allow facile mounting, relocation, removal, and replacement of radiant energy transfer panels for generating or obtaining electrical energy from light.

SUMMARY OF THE INVENTION

The present invention provides an apparatus for radiant energy transfer comprising:
a) at least one radiant energy transfer panel having a light-energy transfer surface and a back surface, wherein the back surface comprises a panel electrode for an electrical connection with the at least one radiant energy transfer panel, and wherein the panel electrode is conductively coupled to a first member of a separable flexible conductive fastener; and
b) a second member of the separable flexible conductive fastener comprising a power connection electrode, wherein the power connection electrode is conductively coupled to a power device, whereby mechanically engaging the first and second members of the separable flexible conductive fastener connects the panel electrode on the at least one radiant energy transfer panel to the power connection electrode.

It is a feature of the present invention that it uses a mechanical fastener to provide both mounting and electrical connection for a radiant energy transfer panel.

It is an advantage of the present invention that it allows a scalable method for connection of power and other signals to and from one or more radiant energy transfer panels, adaptable to a range of configurations.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIG. 4 is a perspective view of a segmented OLED electroluminescent panel;

FIGS. 5A and 5B are cutaway side views showing the use of an edge member at an edge or seam;

FIGS. 7A and 7B are side views showing beaded stem connector elements in alternate embodiments;

DETAILED DESCRIPTION OF THE INVENTION

Figure 1:
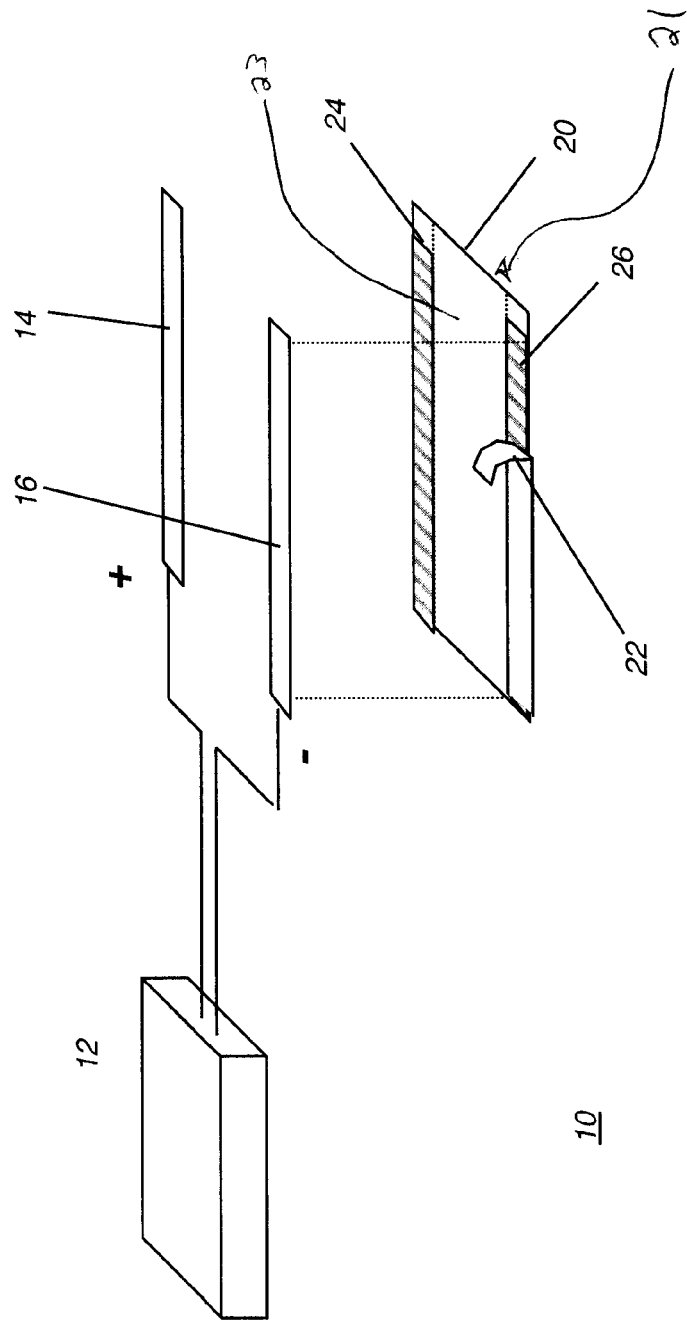
FIG. 1 is a perspective view from above, showing a single panel embodiment.

The present description is directed in particular to elements forming part of, or cooperating more directly with, apparatus in accordance with the invention. It is to be understood that elements not specifically shown or described may take various forms well known to those skilled in the art.

Radiant energy transfer panels, as this term is used herein, include both electroluminescent devices that generate light from electrical energy and photovoltaic devices that generate electrical energy from absorbed light. Both of these types of thin-panel devices have a light-energy transfer surface 21 and a back surface 23. See FIG. 1. The back surface is typically mounted against a panel or other structural surface. In most cases, as in the embodiments described and shown subsequently, the back surface can also be used for electrical connection of the radiant energy transfer panel to a power device, since this arrangement maximizes the available area for radiant energy transfer. The radiant energy itself, whether absorbed or emitted at the light-energy transfer surface, may include visible light as well as infrared, ultraviolet, or other radiation outside the visible spectrum. The power device is an apparatus, component, or system that may provide power to the radiant energy transfer panel, such as from a battery or a power supply for example, or may store, use, or distribute power, including such devices as a battery, a motor, or an electronic device for example.

OLED and Panel Composition

The OLED device is the salient type of electroluminescent thin-panel device that would serve as a light source when using the methods and apparatus of the present invention. For an understanding of the present invention, it is first useful to briefly outline the composition and key operational characteristics of an OLED device. In its basic form, an OLED consists of an anode for hole injection, a cathode for electron injection, and an organic or polymeric medium sandwiched between these electrodes to support charge recombination that yields emission of light. In a basic two-layer EL device structure, described first in U.S. Pat. No. 4,356,429 (Tang), one organic layer of the EL element adjacent to the anode is specifically chosen to transport holes, therefore, it is referred to as the hole transport layer, and the other organic layer is specifically chosen to transport electrons, referred to as the electron transport layer. The interface between the two layers provides an efficient site for the recombination of the injected hole/electron pair and the resultant electroluminescence. At least one of the electrodes of the OLED (typically the anode) must be transparent to light.

In basic OLED operation, a DC voltage bias is applied between anode and cathode electrodes, typically from about 2.5 to 20 Vdc. Due to the thinness of the layers, this relatively low voltage level is sufficient to provide near-breakdown electric fields within the OLED device, causing injection of holes from the anode and electrons from the cathode. Recombination energy is then released as light from the light-energy transfer surface or as heat.

Flexible Connector Mechanism

Flexible hook-and-loop or hook-and-pile connectors, such as VELCRO fasteners from Velcro Industries B.V., Amsterdam, NL, are a familiar type of separable flexible fastening device used in a broad range of applications. While the most common types of separable hook-and-loop fasteners are formed from non-conductive plastic materials, other types of hook-and-loop fasteners have been developed and used. Metal, metallized, or coated hook-and-loop fasteners have been used for radio frequency (RF) shielding and to conduct an electrical signal in various niche applications. For example, U.S. Pat. No. 4,239,046 (Ong) describes a hook-and-pile fastener that includes electrically conductive strands for routing a signal from an electrode to a measurement apparatus or other medical device. Similarly, U.S. Pat. No. 5,457,610 (Bernardoni et al.) describes a selectively metallized hook-and-loop fastener that provides a multi-signal interconnect between circuit assemblies. U.S. Pat. No. 6,729,025 (Farrell et al.) describes conductive VELCRO mounting pads for an electronic circuit mounted on a fabric material.

Separable fasteners such as VELCRO fasteners have two component members that, when manually mated or engaged, grip each other, with the component members held together by means of numerous small mating elements. Not all of these small mating elements need to be fully engaged in order to successfully engage the two members for mounting a panel or other duty; it is only necessary that a sufficient number of mating elements engage between the component members. For example, with VELCRO fasteners, as described in U.S. Pat. No. 3,009,235 (de Mestral), only a percentage of hooks that extend as mating elements from one component member need to engage corresponding loops on the other member.

In addition to VELCRO fasteners, other types of separable flexible fastener are also available and could be provided in conductive form. For example, U.S. Pat. No. 5,691,026 (Zinke et al.) describes various types if flexible connectors that employ multiple engaging elements. These include fasteners where one element has extended headed stems while the complementary element has loops, other mating headed stems, or some other type of engaging elements.

The present invention utilizes a flexible separable conductive fastener that has multiple engaging elements on separable first and second members, such as a conductive VELCRO material or one of these other types, as a mechanism both for mounting a radiant energy transfer panel, such as an OLED panel and for providing its electrical connection to a power device. Unlike other uses for shielding or for point-to-point signal routing, the present invention employs a flexible separable conductive fastener as a type of variable-length bus bar and for providing electrical connection as well as an attachment device for radiant energy transfer panels. As will be evident from the following description, the separable flexible conductive fastener of the present invention has advantages particularly well suited to OLED panel applications, capably combining the functions of mechanical attachment and power trace connection in a single mechanism using a single manual connection.

Single-Panel Embodiment

Referring to FIG. 1, there is shown, in a partially exploded view from the back surface of an electroluminescent panel 20, an illumination apparatus 10 having a power supply 12 as the power device that provides source power to the electroluminescent panel 20. In one embodiment, electroluminescent panel 20 is an OLED panel. Power connection electrodes, shown in FIG. 1 as a positive electrode 14 and a negative electrode 16, are embedded or woven into flexible separable conductive fastener members that are attached to a wall, ceiling, or other surface. Power connection electrodes 14 and 16 mate with their corresponding panel positive and negative electrodes 24 and 26 respectively to provide drive current from power supply 12. A cover tape 22, shown partially removed from electrode 26 in FIG. 1, temporarily protects panel electrodes 24 and 26 until panel 20 is installed. Panel electrode 24 and power connection electrode 14 are a pair of mating members of one flexible separable conductive fastener. Likewise, panel electrode 26 and power connection electrode 16 are a pair of mating members of another flexible separable conductive fastener. In this way, when installed, the corresponding paired positive and negative electrodes 14, 24 and 16, 26 are both mechanically and electrically engaged, so that panel 20 can be illuminated as it lies against and is mechanically held in place by electrodes 14 and 16.

In the basic embodiment of FIG. 1, only a single panel 20 is used and mating electrodes 14, 24 and 16, 26 are of equal length and extend substantially the full length of panel 20, along the edges. However, other arrangements are possible. For example, it may be advantageous to extend power connection electrodes 14 and 16 further than the length of panel 20. This would allow repositioning of panel 20 at any suitable position along the "track" formed by power connection electrodes 14 and 16. Panel electrodes 24 and 26 need not extend continuously along the length of panel 20. Instead, one or more conductive patches could be disposed on panel 20, such as spaced apart at suitable positions. Panel electrodes 24 and 26 could be located anywhere along the back surface of panel 20, even near the middle of panel 20. However, disposing panel electrodes 24 and 26 near edges of panel 20 is a practical arrangement for device mounting.

Power connection and panel electrodes 14, 24 and 16, 26 must be properly paired with respect to electrical (+/−) polarity in order that the diode behavior of panel 20 provide luminescence. To effect proper electrical polarity, any of a number of different types of keying mechanisms can be used. In one straightforward embodiment, panel electrodes 24 and 26 are of opposite mechanical types, thus forcing them to be mechanically mated with the correct power connection electrode 14 and 16 and incompatible with the incorrect electrical connection. For example, panel electrode 24 is a fastener member having hook elements, so that it can only attach to power connection electrode 14 having loop or pile elements; panel electrode 26 is then a component member having pile composition, for mating with power connection electrode 16 having hook or other extended gripping elements.

Figure 6:
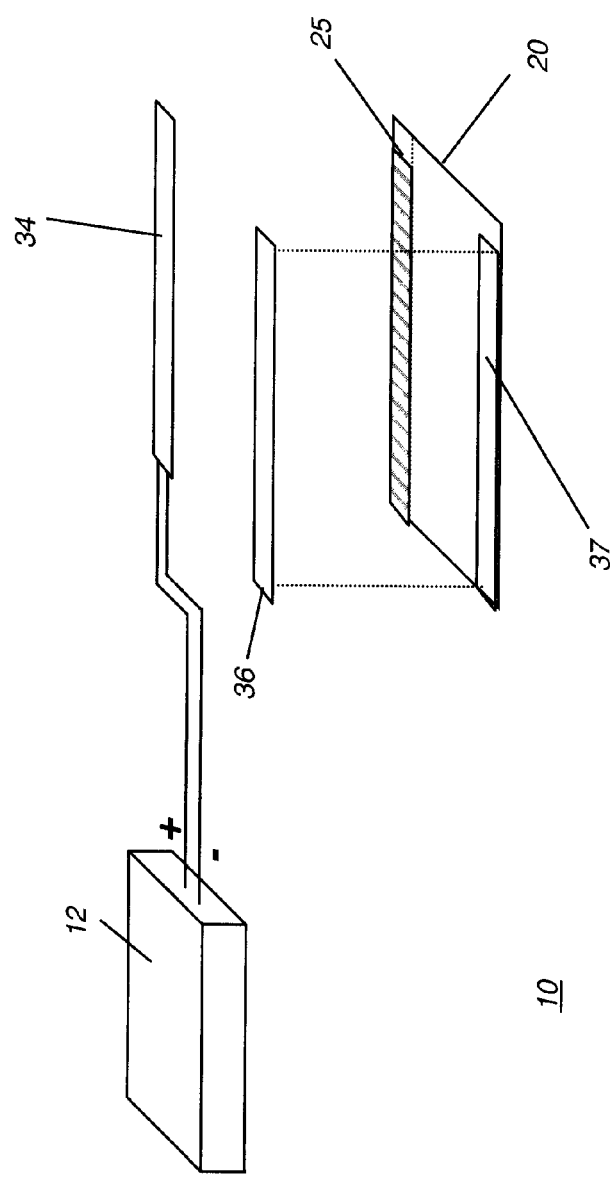
FIG. 6 is a perspective view from above showing an embodiment with power routed through a single conductive fastener.

Referring to FIG. 6, there is shown an alternate embodiment in which a single flexible separable conductive fastener routes the power signal (both + and − for DC) to electroluminescent panel 20. For this embodiment, a connector member 25 is formed on panel 20 and mates with an electrode member 34. Because connector member 25 receives and routes both (+/−) DC power signals, achieving proper alignment for connection of panel 20 would be more difficult than in the simpler connection case of FIG. 1. A separate fastener, not used for power connection or electrical signal routing, is provided by the combination of fastener members 36 and 37, which may be a conventional VELCRO fastener or other type of flexible fastener.

Multiple-Panel Embodiments

Figure 2:
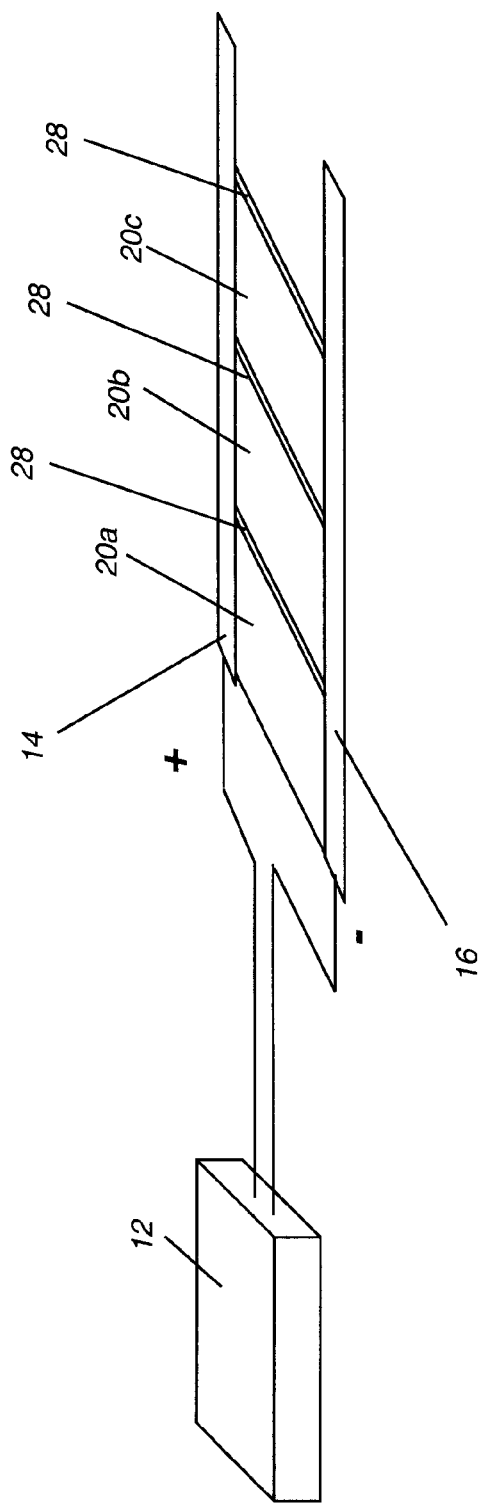
FIG. 2 is a perspective view from above, showing a multiple panel embodiment.
Figure 3:
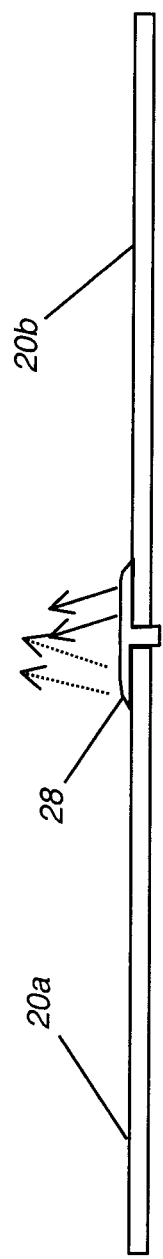
FIG. 3 is a cutaway side view showing an edge member.

Referring to FIG. 2, illumination apparatus 10 has multiple electroluminescent panels 20a, 20b, and 20c. Each of panels 20a, 20b, and 20c is attached to electrodes 14 and 16 and receives power from these components. Edge members 28 are positioned between each of panels 20a, 20b, and 20c. Edge members 28 may provide structural support, to prevent undesirable bowing of panels 20a, 20b, and 20c. Edge members 28 may also be configured so as to improve the uniformity of illumination at seams between panels 20a, 20b, and 20c. For example, FIG. 3 shows a side view of edge member 28 in one embodiment. The index of refraction, surface roughness properties, coloring, and surface curvature of edge member 28 contribute to spread light from each of panels 20a and 20b, thereby minimizing the effect normally obtained when there is a gap between lighting units. In another embodiment, edge members 28 are designed to be light-blocking, so that they conceal edge defects in an electroluminescent panel.

Edge member 28 may also be used as an electrical bus bar for panels 20a, 20b, and 20c. With such an arrangement, edge member 28 would have an electrical connection at one end to one of the power connection electrodes, such as electrode 16. The other end of edge member 28 would be electrically isolated from the other electrode, such as electrode 14, but mechanically connected at that point.

OLED Panel Configuration

As was noted earlier in this specification, the OLED device itself has an emissive layer sandwiched between two electrodes, where one of the electrodes is transparent. Any large-scale OLED illumination panel would most likely be formed from an OLED array that consists of hundreds or thousands of individual emissive diode circuits. Conventional strategies could be used for routing conductive traces for each individual OLED circuit, using vias, signal feed-throughs, and related techniques well known to those skilled in the OLED circuit fabrication art. Using conventional trace-routing techniques, it would be possible to route electrical signals and power to parallel outer edges of panel 20, as shown in FIG. 1. Alternately, there may be advantages to routing either of the electrical power paths so that the two are perpendicular, such as using an arrangement described above with reference to FIG. 2.

The OLED device itself is hermetically sealed to protect its component circuitry from moisture, air, and airborne contaminants in general. For a large scale OLED array, it may not be practical or feasible to provide a sufficiently robust seal for the complete panel. Instead, it may be more practical to fabricate the large scale OLED array as an arrangement of smaller sealed units. Such an arrangement could be used to make the OLED panel configurable in size, at least in one dimension. In one embodiment, for example, the cathode for each OLED cell extends outward from the cell in one direction and is common to all OLED cells in a row. Cutting any one of the OLED cells open destroys that individual cell, but the cathode itself remains common to all connected OLED cells and still conducts electrical current.

Referring to FIG. 4, there is shown an embodiment of OLED panel 20 having multiple cells or segments 30. Each segment 30 may itself be fabricated from an array of tiny OLED devices; however, segments 30, as represented in FIG. 4, would be properly sealed to prevent contamination. Thus, breaking the seal on any of segments 30 would destroy that particular segment 30.

FIG. 4 shows a cut line 32 that is along one edge of OLED panel 20. With the proper arrangement and sizing of segments 30, it would be possible to allow cutting in a direction parallel to cut line 32. This action would destroy each segment 30 that was cut, indicated as damaged segments 31 in FIG. 4. However, only those segments 30 along cut line 32 would be damaged. The performance of adjacent segments 30 would not be affected. The cathode of each OLED segment 30 would run orthogonal to cut line 32, as represented in phantom by cathode traces 56 (only two of which are represented in FIG. 4).

Referring to the side views of FIGS. 5A and 5B, there are shown configurations that use edge members 28 to compensate for damaged segments 31. As shown in these figures, edge members 28 are dimensioned to overlap damaged segments 31 and to redirect light from the nearest undamaged segment 30 so that the effect of damaged segment 31 is minimized. Edge member 28 typically uses refraction and diffusion for light redirection. The configuration in FIG. 5A provides edge member 28 for a seam between two panels 20a and 20b. The configuration in FIG. 5B provides edge member 28 for a single edge. This type of approach requires that segment 30 dimensions be small enough so that edge members 28 could overlap at cut edges where there are damaged segments 31, thereby compensating somewhat for the cutting operation. As can be seen from the examples of FIGS. 5A and 5B, this capability allows cutting of panel 20, at least in one dimension, for applications where custom-fitting is useful. For cutting panel 20 to shorten both length and width dimensions, it is necessary to route electrodes 14 and 16 along an edge or other portion of panel 20 that will not be cut.

Figure 8:
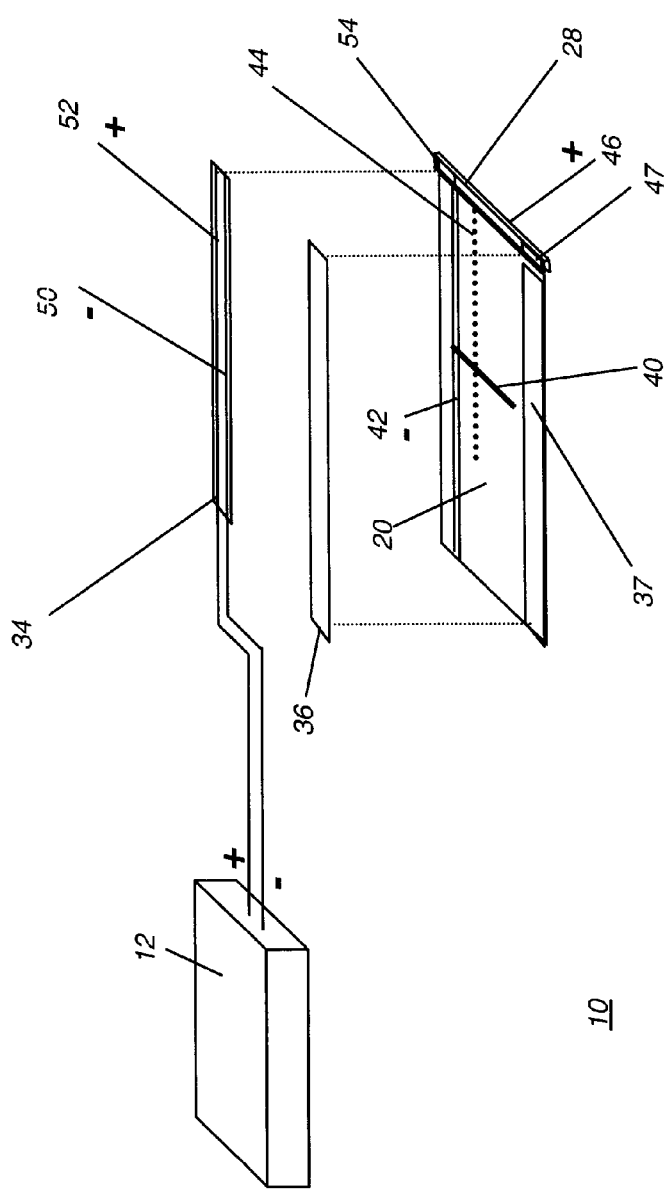
FIG. 8 is a perspective view from above, showing an alternate embodiment for routing source power to an electroluminescent panel.

Alternate power routing schemes may be used. For example, in the embodiment of FIG. 8, drive power is routed to panel 20 using both a separable flexible conductive fastener and using edge member 28. As in the example of FIG. 6, both power traces, shown as power traces 50 and 52 in FIG. 8, are routed through electrode member 34, one half of a separable flexible conductive fastener that mechanically engages with its complementary half, a panel electrode 42. On panel 20 itself, power traces 40 extend the width of panel 20 on the back surface (the top surface from the perspective of FIG. 8) and are perpendicular to the separable flexible conductive fastener that provides panel electrode 42. Only one power trace 40 (represented as the negative-- power trace in the example of FIG. 8) is shown; in practice, there would be multiple power traces extending from panel electrode 42 along the back surface of panel 20. Complementary positive + power traces 44 run along the front surface of panel 20. One power trace 44 is shown in FIG. 8, represented by a dotted line. Power trace 44 extends outward from edge member 28. A front electrode 46 on edge member 28 makes the electrical connection to power traces 44 on the front surface of electroluminescent panel 20 when edge member 28 is fitted into place against panel 20. Power traces 44 may be, for example, cathode traces 56, as were shown in FIG. 4, where electroluminescent panel was cut and resized.

Front electrode 46 obtains its source current by means of a conductive patch 54. Conductive patch 54 is a segment of separable flexible conductive fastener that is sized and positioned to connect only with power trace 52 and to be electrically insulated with respect to power trace 54. At the opposite end of edge member 28, a non-conducting mechanical connection is made between a fastener member 47 and fastener member 36.

Using the arrangement of FIG. 8, it can be readily seen that this same pattern can be extended to allow multiple adjacent electroluminescent panels 20 to be mounted and electrically connected. Numerous modifications of this basic scheme could be employed, such as using edge member 28 to route power to another separable flexible conductive fastener, for example.

Controlling Light Levels

Figure 9:
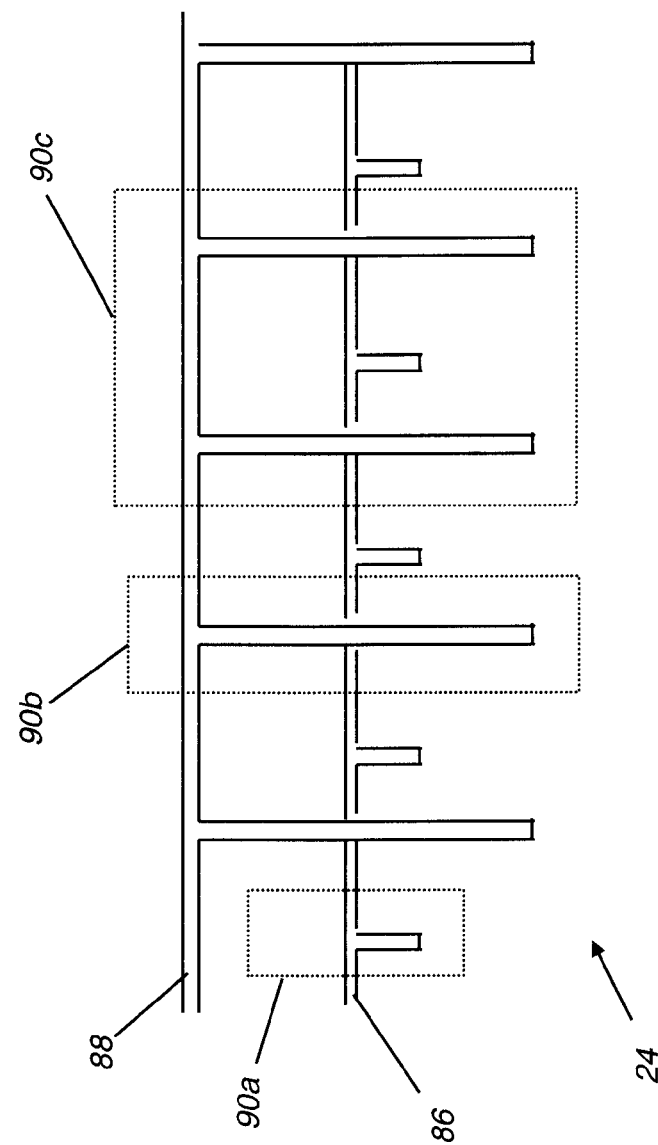
FIG. 9 is a plan view showing a trace pattern on an electrode in an alternate embodiment.

Alternate embodiments of the present invention also allow straightforward methods for controlling light levels from a single-panel or multi-panel electroluminescent arrangement. In one simple embodiment, as shown in FIG. 9, multiple power traces 86 and 88, electrically isolated from connection with each other along the flexible fastener of electrode 24, both provide source current for generating light. Electroluminescent panel 20 has a corresponding arrangement of power traces that connect with power traces 86 and 88. On electroluminescent panel 20, a portion of the emissive cells are configured to make connection with one of the power traces, for example, with power trace 86. The other portion of emissive cells are configured for connection to power trace 88. By removing a patch 90a on electroluminescent panel 20, only the power trace 86 connection can be made. By removing a patch 90b on electroluminescent panel 20, only the power trace 88 connection can be made. By removing a patch 90c, both power traces 88 and 86 are accessible for connection to electroluminescent panel 20. This is one method for a "hard-wired" two- or three-level brightness control: simply by enabling either or both portions of the available OLED segments 30 (FIG. 4) by connection to power traces 86, 88. Alternately, connection of electroluminescent panel 20 to both power traces 86, 88, such as with the patch 90c embodiment of FIG. 9, would allow "three-way" brightness control for an individual electroluminescent panel 20 from power supply 12. This same approach could be extended to provide multiple discrete brightness levels from electroluminescent panel 20. In addition, individual electroluminescent panels 20a, 20b, and 20c in a set of panels (as in FIG. 2) could be configured for control from different power traces 86, 88. The arrangement shown in FIG. 9 could alternately be used to provide separate electrical connection to each of multiple radiant energy transfer panels. Removable patches 90a, 90b, 90c could also be employed for connection of other types of signals to electroluminescent panel 20 or related components.

Conductive Fastener Embodiments

Conductive VELCRO fasteners are just one type of separable flexible conductive fastener that can be used for providing the mechanical and electrical connections of the present invention. As described above with reference to U.S. Pat. No. 5,691,026, other types of separable flexible conductive fasteners may be found to have particular advantages when used according to the present invention.

Although relatively low DC voltage levels are used to drive OLED circuitry, with increased panel size or number of panels 20, the amount of electrical current necessary for illumination may be a concern. For such a case, there would be advantages in a separable flexible conductive fastener arrangement that provides some measure of isolation from incidental contact with live power electrodes.

Referring to FIGS. 7A and 7B, there are shown different embodiments of a separable flexible conductive fastener with electrical isolation. FIG. 7A shows a separable flexible conductive fastener of the beaded stem type. In this embodiment, both mating members 60 and 62 interconnect by meshing together an array of beaded stems 64 and 72 extending from a base 74 and 76, respectively. Beaded stems 64 are electrically conductive, either metallic or coated or otherwise treated to conduct current. Beaded stems 72, however, have an alternate arrangement. Each beaded stem 72 has a non-conductive head 66, at least an outer portion of which is coated or otherwise formed from a non-conductive material. Beneath non-conductive head 66, a conductive portion 68 is formed. Conductive portion 68 may be a coating or some other electrically conductive material. With this arrangement, when mating members 60 and 62 are engaged, there is electrical contact between conductive beaded stems 64 on mating member 60 and conductive portions 68 on beaded stems 72 of mating member 62.

The embodiment of FIG. 7A provides a measure of electrical isolation, since accidental surface contact is only against a surface formed by extending non-conductive heads 66. Electrical contact with mating member 62 only occurs at points beneath non-conductive head 66. Thus, for example, mating member 62 would be connected as power connection electrode 14 or 16 with reference to FIG. 1. Mating member 60 would be used for panel electrodes 24 and 26. Someone casually touching or brushing against mating member 62 would not have electrical contact with power connection electrode 14 or 16.

This same type of isolation is available with the configuration shown in FIG. 7B. Here, mating member 62 has the same composition as in FIG. 7A, with non-conductive head 66 providing isolation from incidental contact. A mesh member 70 having a conductive mesh 80 engages with mating member 62 to make the necessary mechanical and electrical connection.

Various types of arrangements would be possible for "keying" the various electrode connections, as well as other possible signal connections, to electroluminescent panel 20. Mechanical keying would enable only the intended connections to be made, defeating attempts to incorrectly connect a device when using separable flexible conductive fasteners. Standard keying schemes, as is well known in the signal connection arts, could include providing different types of mechanical fastening elements over various portions of the separable flexible conductive fasteners used, so that first and second mating members can only be mechanically engaged with the proper positioning of electroluminescent panel 20. The simplest type of keying scheme, for example, would allow only hook-to-loop connections between components; incorrect loop-to-loop or hook-to-hook mechanical connections would not be workable. More complex keying schemes could provide different types of separable flexible conductive fasteners over different portions of the contact surface of electroluminescent panel 20 or could provide pins or other mechanical devices that appropriately obstruct or guide the engagement of connector members to obtain a proper connection.

Photovoltaic Panel Embodiments

Figure 10:
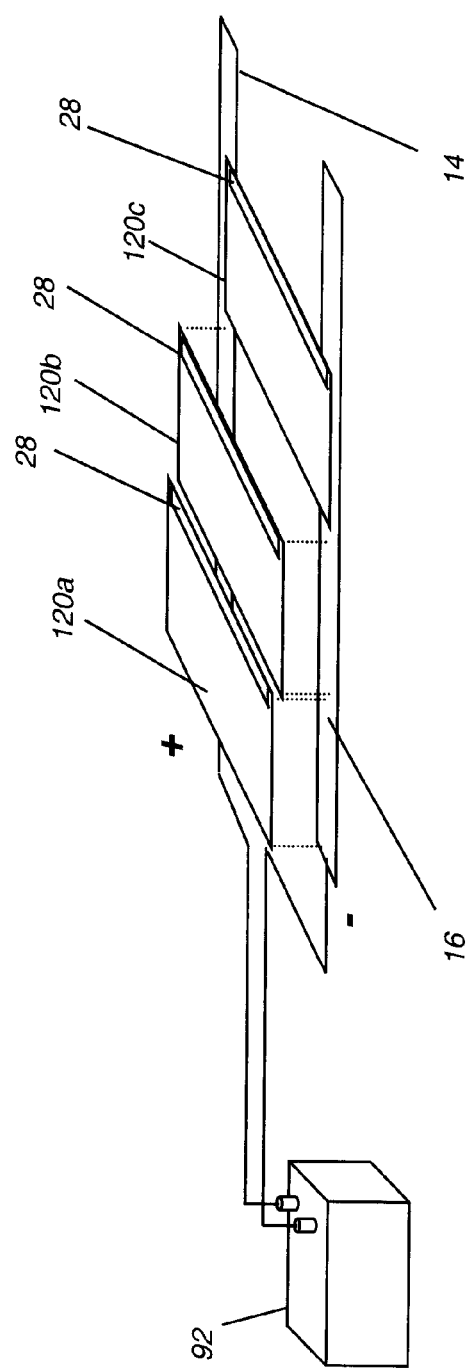
FIG. 10 is a perspective view showing a multiple panel embodiment for photovoltaic energy collection.

While the descriptions of embodiments for FIGS. 1-6 and 8 given above are primarily described with respect to electroluminescent panels 20 as one type of radiant energy transfer panel, many of the same features and components also apply for photovoltaic configurations, such as those that obtain solar energy. Referring to FIG. 10, there is shown, in a partially exploded view for clarity, an embodiment of a photovoltaic energy apparatus 100 using the thin-panel mounting and connection solutions of the present invention. One or more photovoltaic panels 120a, 120b, 120c serve as radiant energy transfer panels, converting radiant energy from the sun or other radiation source to electrical energy. Electrodes 14 and 16 direct this energy to a power device such as a battery 92 or other storage device. Alternately, electrodes 14 and 16 may deliver the energy as electrical current directly to a power distribution system of some type or to some other type of power device, such as to a motor for example. Edge members 28 may be electrically conductive or may simply be supporting components for stable mounting of photovoltaic panels 120a, 120b, 120c. Edge members 28 may help to redirect incident light towards photovoltaic cells in the corresponding photovoltaic panel 120a, 120b, 120c. (Radiant light direction is from above in the view of FIG. 10.)

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, alternate types of separable flexible conductive fastener can be used, in addition to those described in the above embodiments. Electroluminescent panels 20 or photovoltaic panels 120a, 120b, 120c could be provided with various arrangements for access to electrodes, including areas that include a protective covering that might be scraped off or peeled away before a fastener is applied. Conductive adhesives could be used to attach fastener component members to radiant energy transfer panels. Fasteners could be magnetic, thereby improving the electrical contact between mating elements. Various trace pattern arrangements could be used for routing power and other signals to and from the radiant energy transfer panels.

While the examples given above use DC current with positive and negative electrodes, an AC or rectified AC current could alternately be used, between line and ground electrodes, for electroluminescent panels 20. Cutting along an edge, as shown for electroluminescent panel 20 in FIG. 4, could also be performed for an array of photovoltaic cells on photovoltaic panels 120a, 120b, 120c. For example, the same type of trace pattern described for cathode traces 56 in FIG. 4 could be employed for photovoltaic panels 120a, 120b, 120c, wherein one or more of the signal traces is common to each cell in a row and runs orthogonally to a cut line.

Thus, what is provided is an apparatus and method for a flexible mounting scheme that also provides electrical connection to a radiant energy transfer panel.

PARTS LIST 10 illumination apparatus
12 power supply
14 electrode
16 electrode
20 electroluminescent panel
20a electroluminescent panel
20b electroluminescent panel
20c electroluminescent panel
21 light-energy transfer surface
22 cover tape
23 back surface
24 electrode
26 electrode
25 connector member
28 edge member
30 segment
31 damaged segment
32 cut line
34 electrode member
36 fastener member
37 fastener member
40 power trace
42 panel electrode
44 power trace
46 electrode
47 fastener member
50 power trace
52 power trace
54 conductive patch
56 cathode trace
60 mating member
62 mating member
64 beaded stem
66 non-conductive head
68 conductive portion
70 mesh member
72 beaded stem
74 base
76 base
80 conductive mesh
86 power trace
88 power trace
90a patch
90b patch
90c patch
92 battery
100 photovoltaic energy apparatus
120a photovoltaic panel
120b photovoltaic panel
120c photovoltaic panel

The invention claimed is:

1. A method of forming a radiant energy transfer panel from an array of individually sealed segments each having two electrodes, the method comprising:
cutting the array along a cut line;
wherein the cutting step includes damaging a first plurality of segments among the individually sealed segments; and
wherein the damaging step includes breaking seals of the first plurality of segments; and
wherein a second plurality of segments, that are respectively located adjacent to one or more of the first plurality of segments, remain undamaged after the cutting step.

2. The method of claim 1, wherein the radiant energy transfer panel is an electroluminescent panel.

3. The method of claim 2, further comprising a step of:
positioning an optical element to overlap one or more of the first plurality of segments.

4. The method of claim 1, wherein the radiant energy transfer panel is a photovoltaic panel.

5. The method of claim 1, wherein a first electrode of a first segment among the first plurality of segments remains electrically connected to a first electrode of a second segment among the second plurality of segments, after the cutting step.

6. The method of claim 5, wherein the first electrodes are both cathodes of their respective segments.

7. A method of forming a custom-fitted electroluminescent panel with compensation for damaged edges, from an array of individually sealed electroluminescent segments each having two electrodes, the method comprising:
cutting the array along a cut line;
wherein the cutting step includes damaging a first plurality of segments among the individually sealed electroluminescent segments;
wherein the damaging step includes breaking seals of the first plurality of segments; and
wherein, after the cutting step:
a second plurality of segments, that are respectively located adjacent to one or more of the first plurality of segments, remain undamaged; and
a first electrode of a first segment among the first plurality of segments remains electrically connected to a first electrode of a second segment among the second plurality of segments; and
positioning an optical redirector to overlap one or more of the first plurality of segments.

8. The method of claim 7, wherein the optical redirector is a refractive element.

9. The method of claim 7, wherein the optical redirector is a diffusive element.

* * * * *